United States Patent [19]

Chisholm

[11] Patent Number: 4,546,258
[45] Date of Patent: Oct. 8, 1985

[54] CHARGED PARTICLE BEAM APPARATUS
[75] Inventor: Thomas Chisholm, Redhill, England
[73] Assignee: U.S. Philips Corporation, New York, N.Y.
[21] Appl. No.: 466,289
[22] Filed: Feb. 14, 1983
[30] Foreign Application Priority Data Feb. 26, 1982 [GB] United Kingdom ............... 8205652

[51] Int. Cl.$^4$ ............................................. H01J 3/14
[52] U.S. Cl. .............................. 250/396 R; 250/398; 250/396 ML
[58] Field of Search .......... 250/396 ML, 396 R, 398, 250/492.2

[56] References Cited

U.S. PATENT DOCUMENTS 4,110,622  8/1978  Trotel ............................ 250/396 R

FOREIGN PATENT DOCUMENTS 1435526  5/1976  United Kingdom .
1570347  7/1980  United Kingdom .

Primary Examiner—Alfred E. Smith
Assistant Examiner—Jack I. Berman
Attorney, Agent, or Firm—Robert J. Kraus

[57] ABSTRACT

The apparatus, which may be an electron beam column, has a lens system for coarse- and fine-focus adjustments of the beam. The coarse-focus is effected by a magnetic lens (10) and the fine-focus by an electric lens (14) in parallel with the magnetic lens. The electric lens may comprise a plurality of electrically conductive cylinders (14a to 14d) inside the magnetic lens. The cylinders are so arranged that, by applying appropriate potentials to them, fine-focus adjustments can be carried out without causing the beam to rotate.

18 Claims, 4 Drawing Figures

CHARGED PARTICLE BEAM APPARATUS

BACKGROUND OF THE INVENTION

This invention relates to a charged particle beam apparatus comprising means for generating a beam of charged particles, and a lens system including a magnetic lens for focussing the beam.

The beam of charged particles may be used to effect a process at a surface of a target. For example, in the field of semiconductor technology it is known to use a charged particle beam apparatus in the form of a so-called electron beam column to direct an electron beam towards a semiconductor wafer coated with an electron sensitive resist and to write a predetermined pattern in the resist by computer control of the beam. After exposure the resist is developed to form a masking layer which can be used subsequently in the processing of the semiconductor wafer.

A conventional electron beam column produces a Gaussian, round beam spot which is scanned across the target to write the desired pattern. Although this exposure technique has the advantage of Providing optimum pattern flexibility it suffers from the drawback of being relatively slow.

Shorter exposure times can be achieved by using an electron beam column capable of producing a larger, square-shaped beam spot of fixed size. In this case the pattern is written by moving the shaped beam in discrete steps across the target.

Recent developments in the technology of electron beam columns have made it possible to shorten exposure times still further by using a rectangular-shaped beam spot whose size and shape can be altered to fit the various areas of the pattern to be exposed. This technique is known as variable-shaped beam imaging. The shaping variations are performed while the beam is stepped from one position to the next.

The lens system of a typical variable-shaped electron beam column basically comprises five magnetic lenses. In this context reference is invited to U.S. Pat. No. 4,243,866 and more particularly to the description with reference to FIG. 6. While the electron-beam column described there comprises various other elements, the basic lens constituents are as follows. Firstly, after the electron source there are two magnetic lenses associated with the beam shaping facility. Then, moving along the length of the column away from the electron source, there is a pair of demagnifying lenses and finally a so-called projection lens. Essentially these lenses are all arranged in series in the sense that, travelling the length of the column, the electron beam experiences the field of each lens in turn.

In the present context a magnetic lens normally comprises an electrically conductive coil which is enclosed within a soft ferromagnetic member forming the pole pieces of the magnet. The coil is disposed in the vicinity of the electron beam path so that the beam of electrons can be focussed by the action of the magnetic field produced by the passage of direct current through the coil. The magnetic field strength produced by the magnet is dependent on the magnitude of the current flowing in the coil so that the focussing effect (i.e. the strength) of the lens can be altered simply by increasing or decreasing the current. It is noted here that magnetic focussing is inevitably accompanied by rotation of the beam and the extent of this rotation is dependent on the strength of the magnetic lens.

However, there are occasions when the focussing of the electron beam column has to be altered within a limited range while the machine is actually operating. This may be necessary, for example, when there is a change in the height of the target on which the electron beam is impinging or when the size of the beam spot (and hence the beam current) is to be altered. In order not to erode the advantage of the fast exposure times which are capable with the variable-shaped electron beam column the refocussing should be completed in a time period similar to that taken to change the spot size, typically tens of nanoseconds. Unfortunately the time taken to change the strength of a magnetic lens by altering the current flow is considerably greater than this because of the inductance of the coil. Therefore, although the variable-shaped electron beam column is capable of fast exposure times, the number of wafers which can be processed per unit time by the machine can be limited by the relatively long times necessary for adequate refocussing.

SUMMARY OF THE INVENTION

According to the present invention a charged particle beam apparatus comprising means for generating a beam of charged particles, and a lens system including a magnetic lens for focussing said beam is characterized in that the lens system further includes an electric lens arranged in parallel with the magnetic lens such that the strength of the electric lens can be varied without causing the beam to rotate.

As the name implies, the electric lens produces an electric field for focussing the beam of charged particles. The strength of the electric lens can be altered significantly more quickly than a magnetic lens so that fine-focussing re-adjustments can readily be made in a time period similar to that taken to change the spot size of the charged particle beam. However, not only can a charged particle beam apparatus in accordance with the invention refocus more quickly than prior art apparatuses, but it does so without causing rotation of the charged particle beam. As mentioned above, the magnetic lens causes the beam to rotate but the electric lens causes no further rotation. Moreover, the electric lens is arranged in parallel with the magnetic lens in the sense that for at least part of the time when the beam experiences the field of one of the lenses it experiences simultaneously the field of the other lens. As such the different lenses can be arranged so as to avoid the need for the overall length of the apparatus to be any greater than its prior art counterpart. Although the lenses are arranged in parallel the strength of the electric lens can be varied substantially without affecting the strength of the magnetic lens. Thus it is possible to carry out fine-focus adjustments of the charged particle beam in a very short time period merely by changing the strength of the electric lens without the need to modify the strength of the magnetic lens.

If the charged particle beam is travelling generally in the z-direction along the length of the apparatus, then the rotation of the beam produced by the magnetic lens is proportional to $\int (B_z/\eta(V)) \, dz$ where $B_z$ is the axial component of the flux density and $V$ is the electric potential. When an electric lens is included in parallel with the magnetic lens further rotation of the charged particle beam will be avoided only if the potential distribution is such that the value of this integral remains constant as the strength of the electric lens is varied. In the present context an electric lens is a lens which can focus the beam of charged particles by the action of an electric field produced as a result of an electric potential being applied to the lens. By applying a potential to the lens the potential distribution along the length of the lens is altered and so, on the face of it, varying the strength of the electric lens would cause the beam to rotate. However rotation can be avoided in a relatively straightforward manner by the use of an electric lens comprising various arrangements of three or more open-ended, co-axial cylinders which are made of non-magnetic electrically conductive material and which are situated inside the magnetic lens as described in more detail below. In one example the electric lens comprises four cylinders each having the same diameter. However, in order that the beam of charged particles is screened from extraneous electric fields when it passes through the lens, neighbouring cylinders may be disposed in overlapping relationship. In another arrangement the screening function is performed by a large-diameter cylinder which surrounds two or more smaller cylinders.

Preferably, the electric lens is symmetrical about the center of the magnetic lens and the length of the electric lens is at most twice the focal length of the magnetic lens.

As will become evident from the description which follows a charged particle beam apparatus in accordance with the invention is particularly straightforward to use when the cylinders, with the possible exception of the cylinder at each extremity of the electric lens, are all of equal length.

The strength of the magnetic lens is determined by the integral $\int (B_z^2/V) \, dz$. Comparing this with the earlier integral associated with the rotation of the beam it is evident that the strength of the magnetic lens of a charged particle beam apparatus in accordance with the invention is unaffected by variations in the strength of the electric lens. Therefore, as mentioned above, fine-focus adjustments of the beam can be effected merely by varying the potential on the electric lens without modifying the strength of the magnetic lens.

BRIEF DESCRIPTION OF THE DRAWINGS

Embodiments of the invention will now be described, by way of example, with reference to the accompanying drawings, in which.

It is noted that, for the sake of clarity, the Figures are not drawn to scale.

DESCRIPTION OF THE PREFERRED EMBODIMENTS

Figure 1:
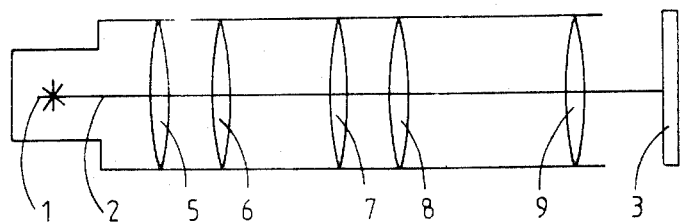
FIG. 1 is a diagrammatic representation of a prior art variable-shaped electron beam column.

FIG. 1 is a diagrammatic representation of a known variable-shaped electron beam column showing the basic constituent of the lens system. The column comprises an electron source 1 for generating a beam 2 of electrons which is directed towards a target 3 such as a semiconductor wafer coated with an electron sensitive resist. Before striking the semiconductor wafer 3 the beam 2 passes through five magnetic lenses. The first two lenses 5,6 are associated with the beam shaping facility of the column. It is noted that all the lenses are shown diagrammatically in FIG. 1. As is well known to those skilled in the art, a conventional magnetic lens comprises an electrically conductive coil which is enclosed within a soft ferromagnetic member forming the pole pieces of the magnet. The electron beam 2 can travel through the bore of the coil so that it experiences the magnetic field of the lens. After the lenses 5,6, the electron beam 2 passes through two demagnifying lenses 7,8 before passing through a final magnetic projection lens 9 and eventually impinging on the semiconductor wafer 3. The construction of a variable-shaped electron beam column is well known to those skilled in the art and so no further details will be given here. For more information reference is invited, for example, to the U.S. Pat. No. 4,243,866 mentioned above.

Figure 2:
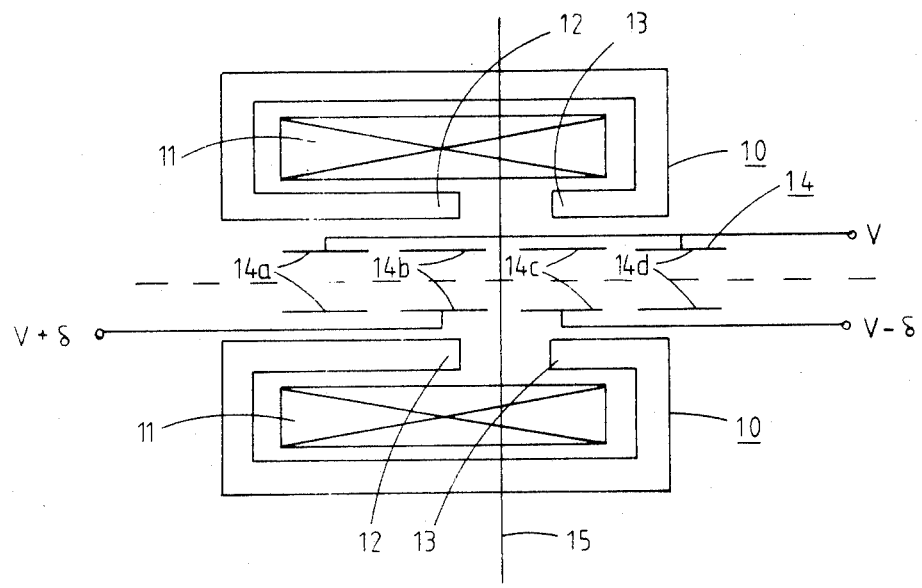
FIG. 2 is a diagrammatic cross-section of part of an electron beam column in accordance with the invention.

FIG. 2 shows part of the lens system of a variable-shaped electron beam column in accordance with the invention. The single magnetic lens 10 shown in the Figure is of conventional design and may for example comprise an electrically conductive coil 11 and pole pieces 12,13. The pole pieces 12,13 may be made from a soft ferromagnetic material such as soft iron. The magnetic lens 10 is generally cylindrical and the central axis of lens 10 is coincident with the central axis (shown as a broken line in FIG. 2) of the electron beam column. The bore of lens 10, i.e. its diameter, may be 50 mm and the spacing of the pole pieces 12 and 13 may be 10 mm. The focal length of the magnetic lens 10 may be, for example, 40 mm.

The part of the lens system shown in FIG. 2 also comprises an electric lens 14 arranged in parallel with the magnetic lens 10 in the sense that for at least part of the time when the electron beam experiences the field of one of the lenses it experiences simultaneously the field of the other lens. As shown in FIG. 2 the electric lens comprises four open-ended, mutually co-axial electrically conductive cylinders 14a, 14b, 14c, 14d inside the magnetic lens 10. The cylinders 14a, 14b, 14c, 14d, are arrananged symmetrically about plane 15 situated midway between the pole pieces 12,13 and the central axes of the cylinders 14a, 14b, 14c, 14d are coincident with the central axis of the column. The cylinders, which are made of a non-magnetic, electrically conductive material such as stainless steel, all have a diameter of 15 mm. and a length of 20 mm. Neighboring cylinders are disposed in close proximity, but they are spaced apart along their axes in order that they are mutually insulated.

In order to maintain the cylinders in their correct positions and to facilitate mounting the whole electric lens 14 inside the magnetic lens 10, the individial cylinders may be mounted in an insulating former (not shown) having a cylindrical bore, the cylinders being accommodated and fixed in appropriately shaped recesses present in the internal surface of the former.

It is noted here that the electric field which is set up when different potentials are applied to the various cylinders is independent of the length of the cylinders 14a, 14d at the extremities of the electric lens 14. Thus the length of cylinders 14a, 14d can be varied without affecting the operation of the lens. However, the magnetic field is approximately symmetrical about plane 15 and so it is preferable that the inner cylinders 14b, 14c are the same length so that the potential applied to the respective inner cylinders 14b, 14c can be altered with respect to the outer cylinders 14a, 14d by the same amount but in opposite senses without causing the beam to rotate (i.e. without altering the value of the integral $\int (B_z/\eta(V)) \, dz$).

Thus the outer cylinders 14a, 14d may each be at a potential V while a potential of V+δ is applied to cylinder 14b and a potential V-δ is applied to cylinder 14c, where the value of δ is small compared with the mean energy of the electron beam 2 when it passes through lenses 10 and 14. The potential V would typically be 0 volts when the electron beam 2 has a mean energy of 20 keV and in this case the potential difference δ between the outer and inner cylinders may be as much as 400 volts. By varying the value of δ fine adjustments can be made to the focussing of the electron beam.

Voltage differences larger than 400 volts may be applied to the cylinders, but in order to avoid rotation of the beam the potential difference between cylinders 14a and 14b will then have to be different to the potential difference between cylinders 14c and 14d so that the potential distribution over the whole length of the lens 14 maintains the constant value of the integral $\int (B_z/\eta(V)) \, dz$.

As mentioned above, the electric field associated with lens 14 is independent of the length of the cylinders 14a, 14d at the extremities of lens 14. In the present context the length of the electric lens 14 refers to the distance over which the electric field extends to any appreciable extent. More quantitatively, the approximate length of the electric lens is given by the distance between the inward-facing edges of the two extreme cylinders 14a, 14d plus the diameter of each of the two extreme cylinders. Thus in the present example the length of the electric lens is approximately 70 mm. (i.e. (2×20)mm+(2×15)mm) which is less than twice the focal length (i.e. 2×40 mm) of the magnetic lens 10.

Figure 3:
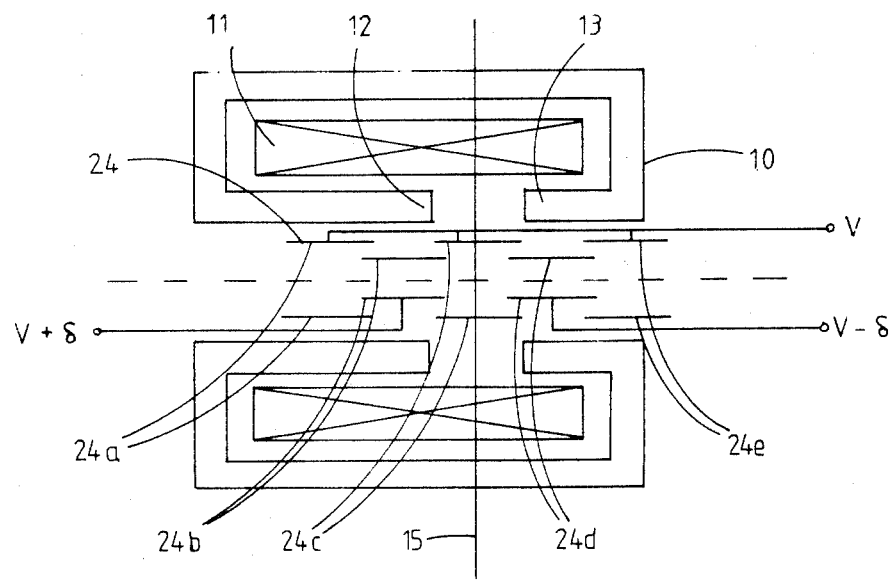
FIG. 3 is a diagrammatic cross-section of part of a different electron beam column in accordance with the invention.

FIG. 3 shows a part of another variable-shaped electron beam column in accordance with the invention and, as before, the electric lens 24 is situated inside the magnetic lens 10. The magnetic lens 10 is the same as that described with reference to FIG. 2, but in this example the electric lens comprises five open-ended, co-axial cylinders 24a, 24b, 24c, 24d, 24e which are made of a non-magnetic, electrically conductive material such as stainless steel and which can be divided into two groups. The cylinders of the first group, i.e. cylinders 24a, 24c, 24e, all have the same diameter for example 10 mm while the cylinders of the second group, i.e. cylinders 24b, 24d, both have the same, smaller diameter for example 7 mm. Again the cylinders are arranged symmetrically about the center plane 15 of magnetic lens 10. Each cylinder may be 20 mm long and the axial spacing between adjacent cylinders of a group may be 10 mm, but as before the length of the cylinders 24a, 24e at the extremities of the electric lens does not affect the operation of this lens. The second group of cylinders 24b, 24d are respectively disposed between and in overlapping relationship with the cylinders 24a, 24c, 24e of the first group. With the dimensions given here, neighbouring cylinders overlap each other by 5 mm. This overlap results in greater focussing accuracy because the electron beam 2 is screened from extraneous electric fields when it passes through the electric lens 24. The approximate length of the electric lens 24 in this example is given by the distance between the outward-facing edges of the two smaller cylinders 24b, 24d plus the diameter of each of the two extreme cylinders 24a, 24e. Thus the length of the electric lens is approximately 70 mm which is less than twice the focal length of the magnetic lens 10 (i.e. 2×40 mm).

In this example the cylinders 24a, 24c and 24e of the first group are maintained at a potential V. A potential of V+δ is applied to cylinder 24b and a potential of V-δ is applied to cylinder 24d. The value of δ can be varied so as to adjust the focussing of the electron beam but, as explained above, δ should be small compared with the mean energy of the electron beam in passing through the lens combination. As before δ can be as high as 400 V if the mean energy of the electron beam is of the order of 20 keV. Even larger potentials may be applied to the smaller cylinders 24b, 24d but at the expense of losing symmetry because the potential difference between cylinders 24b, 24d and their respective neighbouring cylinders must be adapted to maintain the constant value of $\int (B_z/\eta(V)) \, dz$.

As shown in FIG. 3 the cylinders 24a, 24c, 24e of the first group are larger in diameter than the cylinders 24b, 24d of the second group. In an alternative arrangement the diameter of the first group of cylinders may be smaller than that of the second group. Thus, for example, the diameter of cylinders 24a, 24c, 24e may be 7 mm while the diameter of cylinders 24b, 24d may be 10 mm. In this case the approximate length of the electric lens is given by the distance between the inward-facing edges of the two extreme cylinders 24a, 24e plus the diameter of each of the two extreme cylinders. Thus the length of the electric lens is approximately 54 mm which again is less than twice the focal length of the magnetic lens 10 (i.e. 2×40 mm).

Figure 4:
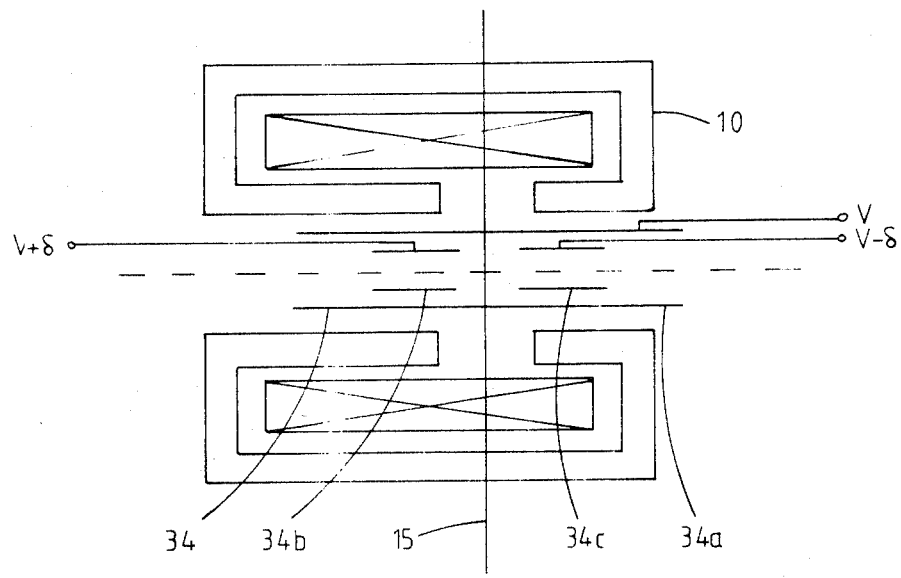
FIG. 4 is a diagrammatic cross-section of part of a further electron beam column in accordance with the invention.

FIG. 4 shows a part of yet another variable-shaped electron beam column in accordance with the invention and, as before, the electric lens 34 is situated inside the magnetic lens 10. The magnetic lens 10 may be the same as that described above, but in this example the electric lens 34 comprises only three open-ended, co-axial cylinders 34a, 34b, 34c which again may be made of a non-magnetic, electrically conductive material such as stainless steel. The cylinders 34b, 34c which have the same diameter, namely 7 mm, and the same length, namely 20 mm, are spaced apart along their axes by, for example 10 mm. The cylinders 34b, 34d are surrounded by a third, larger cylinder 34a which has a diameter of 10 mm. All the cylinders 34a, 34b, 34c are symmetrical about the center plane 15 of the magnetic lens 10. In this example the overall length of the electric lens is approximately 70 mm which is given by the distance between the outward-facing edges of the two inner cylinders 34b, 34c plus twice the diameter of the surrounding cylinder 34a. The length of the surrounding cylinder 34a is not critical but it should be greater than the length of the electric lens in order that the electron beam is screened from extraneous electric fields.

To use this lens combination a potential of V is applied to cylinder 34a. A potential of V+δ is applied to cylinder 34b and a potential of V-δ is applied to cylinder 34c. The value of δ can be varied so as to adjust the focussing of the electron beam. Once again δ should be small compared with the mean energy of the electron beam as it passes through the lens combination. By sacrificing symmetry, however, larger potentials may be employed.

The electric lenses described in the above examples may be used in parallel with either of the demagnifying magnetic lenses 7,8 or with the projection lens 9 (see FIG. 1) of the electron beam column. Moreover two or even three such electric lenses may be used respectively in parallel with any combination of the three magnetic lenses 7, 8, 9 as appropriate.

In the light of the examples described above it will be evident to the person skilled in the art that many modifications may be made within the scope of the invention. Thus, for example, the cylinders of the electric lens may have lengths which differ from one another. In order to avoid rotation of the beam in that case, however, the potentials which are applied to the cylinders must then be chosen such that the value of $\int (B_z/\eta(V))\,dz$ is not altered.

Finally, attention is drawn to the fact that, while the above examples have related to a variable-shaped electron beam column, the invention is applicable also to electron beam columns producing a beam spot whose size and shape is fixed. Moreover, the apparatus of the invention may be, for example, an electron beam microscope or a machine producing a beam of charged particles other than electrons.

What I claim is:

1. A charged particle beam apparatus comprising: means for generating a beam of charged particles; a lens system including a magnetic lens for focussing said beam and an electric lens arranged in parallel with the magnetic lens, the strength of said electric lens being subject to variation independently of said magnetic lens by variation of electrical potentials applied to said electric lens without causing the beam to rotate, fine focussing of said beam being facilitated by said strength variation of said electric lens.

2. A charged particle beam apparatus as claimed in claim 1, in which the electric lens is symmetrical about the center of the magnetic lens.

3. A charged particle beam apparatus as claimed in either of the preceding claims, in which the length of the electric lens is less than twice the focal length of the magnetic lens.

4. A charged particle beam apparatus as claimed in claim 2, wherein said electric lens comprises at least three open-ended, co-axial cylinders which are made of a non-magnetic, electrically conductive material and which are situated inside the magnetic lens.

5. A charged particle beam apparatus as claimed in claim 4, in which first and second cylinders are spaced apart along their axes, and a third cylinder surrounds both the first and second cylinders.

6. A charged particle beam apparatus as claimed in claim 5, in which the first and second cylinders have the same diameter.

7. A charged particle beam apparatus as claimed in claim 5 or claim 6, in which the first and second cylinders have the same length.

8. A charged particle beam apparatus as claimed in claim 2, wherein said electric lens comprises at least four open-ended, co-axial cylinders which are made of a non-magnetic, electrically conductive material and which are situated inside the magnetic lens, all of which cylinders have the same diameter.

9. A charged particle beam apparatus as claimed in claim 2, wherein said electric lens comprises at least four open-ended, co-axial cylinders which are made of a non-magnetic, electrically conductive material and which are situated inside the magnetic lens, neighbouring cylinders being disposed in overlapping relationship.

10. A charged particle beam apparatus as claimed in claim 8 or claim 9, in which all the cylinders, apart from the cylinder at each extremity of the electric lens, are of equal length.

11. A charged particle beam apparatus as claimed in claim 10, in which all the cylinders are of equal length.

12. A charged particle beam apparatus as claimed in claim 9, in which the electric lens comprises a first group of three cylinders having one diameter and a second group of two cylinders having another diameter, the cylinders of the first group being spaced apart along their axes, and the cylinders of the second group being respectively disposed between and in overlapping relationship with the cylinders of the first group.

13. A charged particle beam apparatus as claimed in claim 1 wherein said electric lens comprises at least three open-ended, co-axial cylinders which are made of a non-magnetic electrically conductive material and which are situated inside the magnetic lens.

14. A charged particle beam apparatus as claimed in claim 1, wherein said electric lens comprises at least four open-ended, co-axial cylinders which are made of a non-magnetic, electrically conductive material and which are situated inside the magnetic lens, all of which cylinders have the same diameter.

15. A charged particle beam apparatus as claimed in claim 1 wherein said electric lens comprises at least four open-ended, co-axial cylinders which are made of a non-magentic, electrically conductive material and which are situated inside the magnetic lens, neighboring cylinders being disposed in overlapping relationship.

16. A charged particle beam apparatus as claimed in claim 10 wherein the electric lens comprises a first group of three cylinders having one diameter and a second group of two cylinders having another diameter, the cylinders of the first group being spaced apart along their axes, and the cylinders of the second group being respective disposed between and in overlapping relationship with the cylinders of the first group.

17. A charged particle beam apparatus as claimed in claim 1, wherein said electric lens includes at least two elements at different electric potentials, and at least a third element at an electric potential between said different potentials of said at least two elements, the potential differences between said at least two and said third element being substantially simultaneously increased or decreased as required to effect refocussing of said beam.

18. A charged particle beam apparatus as claimed in claim 8, wherein three of said cylinders are at different electrical potentials, the potential level differences between all of said three elements being substantially simultaneously increased or decreased as required to effect refocussing of said beam.

* * * * *